United States Patent
Em

(10) Patent No.: US 8,045,368 B2
(45) Date of Patent: Oct. 25, 2011

(54) PHASE-CHANGE MEMORY DEVICE

(75) Inventor: Ho-Seok Em, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 368 days.

(21) Appl. No.: 12/345,949

(22) Filed: Dec. 30, 2008

(65) Prior Publication Data

US 2010/0149860 A1    Jun. 17, 2010

(30) Foreign Application Priority Data

Dec. 12, 2008    (KR) ........................ 10-2008-0126414

(51) Int. Cl.
*G11C 11/00*    (2006.01)
(52) U.S. Cl. .................... 365/163; 365/230.08; 365/239
(58) Field of Classification Search .................. 365/163, 365/230.08, 239
See application file for complete search history.

(56) References Cited

U.S. PATENT DOCUMENTS

| | | | | |
|---|---|---|---|---|
| 7,545,677 B2 * | 6/2009 | Lee et al. | ................. | 365/185.18 |
| 2008/0310234 A1 * | 12/2008 | Lee et al. | ................. | 365/185.18 |
| 2010/0277968 A1 * | 11/2010 | Tokiwa | ........................ | 365/148 |

FOREIGN PATENT DOCUMENTS

KR    100590388 B1    6/2006

OTHER PUBLICATIONS

Notice of Preliminary Rejection issued from Korean Intellectual Property Office on May 31, 2010.

* cited by examiner

*Primary Examiner* — Tuan T. Nguyen
(74) *Attorney, Agent, or Firm* — IP & T Group LLP

(57) ABSTRACT

A phase-change memory device performs a buffer program operation in response to a buffer program command sequence. The phase-change memory device includes a page buffer unit configured to store a plurality of input data corresponding to a word count value of a buffer program command sequence and selectively output the stored input data in response to a selection signal, and a page buffer control unit configured to generate the selection signal determined by counting a value representing the word count value.

15 Claims, 8 Drawing Sheets

FIG. 8

| Decimal | CNT<0> | CNT<1> | CNT<2> | CNT<3> | CNT<4> | | |
|---|---|---|---|---|---|---|---|
| 0 | 0 | 0 | 0 | 0 | 0 | PB_Control<0> ACTIVATION | PBG_EN<0> ACTIVATION PERIOD |
| 1 | 1 | 0 | 0 | 0 | 0 | PB_Control<1> ACTIVATION | |
| 2 | 0 | 1 | 0 | 0 | 0 | PB_Control<2> ACTIVATION | |
| 3 | 1 | 1 | 0 | 0 | 0 | PB_Control<3> ACTIVATION | |
| 4 | 0 | 0 | 1 | 0 | 0 | PB_Control<4> ACTIVATION | |
| 5 | 1 | 0 | 1 | 0 | 0 | PB_Control<5> ACTIVATION | |
| 6 | 0 | 1 | 1 | 0 | 0 | PB_Control<6> ACTIVATION | |
| 7 | 1 | 1 | 1 | 0 | 0 | PB_Control<7> ACTIVATION | |
| 8 | 0 | 0 | 0 | 1 | 0 | PB_Control<0> ACTIVATION | PBG_EN<1> ACTIVATION PERIOD |
| 9 | 1 | 0 | 0 | 1 | 0 | PB_Control<1> ACTIVATION | |
| 10 | 0 | 1 | 0 | 1 | 0 | PB_Control<2> ACTIVATION | |
| 11 | 1 | 1 | 0 | 1 | 0 | PB_Control<3> ACTIVATION | |
| 12 | 0 | 0 | 1 | 1 | 0 | PB_Control<4> ACTIVATION | |
| 13 | 1 | 0 | 1 | 1 | 0 | PB_Control<5> ACTIVATION | |
| 14 | 0 | 1 | 1 | 1 | 0 | PB_Control<6> ACTIVATION | |
| 15 | 1 | 1 | 1 | 1 | 0 | PB_Control<7> ACTIVATION | |
| 16 | 0 | 0 | 0 | 0 | 1 | PB_Control<0> ACTIVATION | PBG_EN<2> ACTIVATION PERIOD |
| 17 | 1 | 0 | 0 | 0 | 1 | PB_Control<1> ACTIVATION | |
| 18 | 0 | 1 | 0 | 0 | 1 | PB_Control<2> ACTIVATION | |
| 19 | 1 | 1 | 0 | 0 | 1 | PB_Control<3> ACTIVATION | |
| 20 | 0 | 0 | 1 | 0 | 1 | PB_Control<4> ACTIVATION | |
| 21 | 1 | 0 | 1 | 0 | 1 | PB_Control<5> ACTIVATION | |
| 22 | 0 | 1 | 1 | 0 | 1 | PB_Control<6> ACTIVATION | |
| 23 | 1 | 1 | 1 | 0 | 1 | PB_Control<7> ACTIVATION | |
| 24 | 0 | 0 | 0 | 1 | 1 | PB_Control<0> ACTIVATION | PBG_EN<3> ACTIVATION PERIOD |
| 25 | 1 | 0 | 0 | 1 | 1 | PB_Control<1> ACTIVATION | |
| 26 | 0 | 1 | 0 | 1 | 1 | PB_Control<2> ACTIVATION | |
| 27 | 1 | 1 | 0 | 1 | 1 | PB_Control<3> ACTIVATION | |
| 28 | 0 | 0 | 1 | 1 | 1 | PB_Control<4> ACTIVATION | |
| 29 | 1 | 0 | 1 | 1 | 1 | PB_Control<5> ACTIVATION | |
| 30 | 0 | 1 | 1 | 1 | 1 | PB_Control<6> ACTIVATION | |
| (31) | 1 | 1 | 1 | 1 | 1 | PB_Control<7> ACTIVATION | |

← APPLIED WORD COUNT VALUE

← DOWN-COUNTING

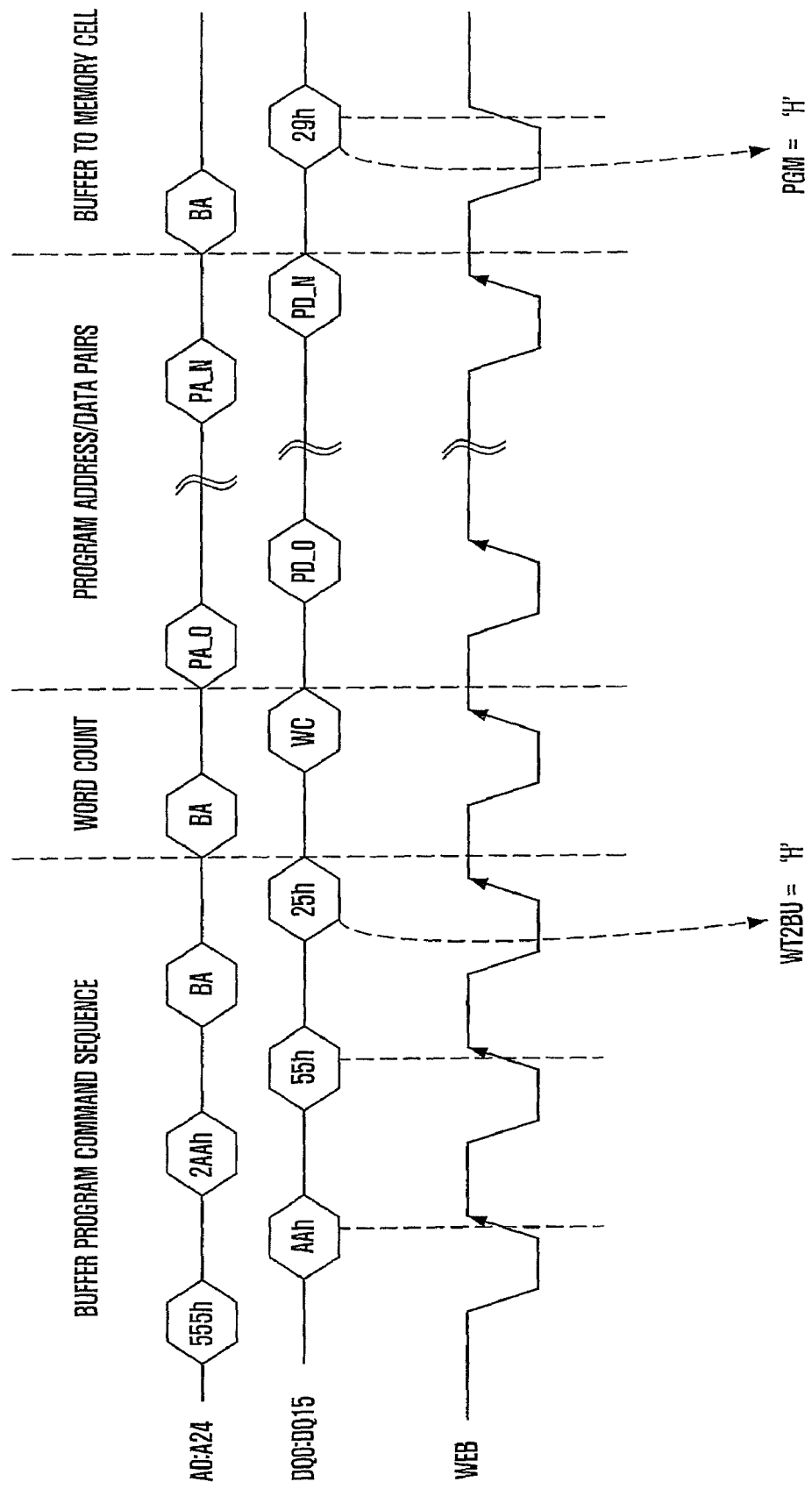

PHASE-CHANGE MEMORY DEVICE

CROSS-REFERENCE TO RELATED APPLICATION

The present invention claims priority of Korean patent application number 10-2008-0126414, filed on Dec. 12, 2008, which is incorporated by reference in its entirety.

BACKGROUND OF THE INVENTION

The present invention relates to a semiconductor design technology, and more particularly, to a technology for controlling a page buffer of a phase-change memory device.

Among various memory devices, a dynamic random access memory (DRAM), used as a computer main memory device, is capable of random access and high integration at a low cost. However, the DRAM has a drawback of being a volatile memory. While a static random access memory (SRAM), used as a cache memory, is capable of random access and is faster than the DRAM in the operating speed, the SRAM has the same drawback. The SRAM is disadvantageous in terms of cost because it has a memory cell size larger than that of the DRAM. A NAND flash memory, which is a nonvolatile memory, is capable of high integration at a low cost and is advantageous in terms of power consumption. However, the NAND flash memory has a low operating speed because it is incapable of random access.

A phase-change random access memory (PCRAM) device is an example of various memory devices that have been developed to overcome the drawbacks of such conventional memory devices. The PCRAM device is capable of random access and high integration at a low cost as a nonvolatile memory. The PCRAM device stores data using a phase changeable material. That is, the PCRAM device is a nonvolatile memory device that uses a phase change of a phase changeable material depending on the temperature conditions, i.e., a resistance change proportional to the phase change.

The phase changeable material has an amorphous state or a crystalline state depending on the temperature conditions. A typical example of the phase changeable material is a chalcogenide alloy, one of which, generally used, is Ge2Sb2Te5 (GST) using germanium (Ge), antimony (Sb), and tellurium (Te). The phase changeable material is generally called GST.

The PCRAM device generates a reversible phase change between the crystalline state and the amorphous state of the phase changeable material GST by using Joule heat generated by applying a specific current or voltage to the phase changeable material GST. The crystalline state of the phase changeable material GST is called a set state in terms of circuit. In the set state, the phase changeable material GST has electrical characteristics like a metal with a low resistance. The amorphous state of the phase changeable material GST is called a reset state in terms of circuit. In the reset state, the phase changeable material GST has a resistance higher than the set state. That is, the PCRAM device stores data on the basis of a resistance change between the crystalline state and the amorphous state, and reads the stored data by detecting a current change through the phase changeable material GST or a voltage change depending on a current change. In general, the set state is defined as having a logic level of '0' and the reset state is defined as having a logic level of '1'. The phase changeable material GST maintains its state even when the power supply is interrupted.

Meanwhile, programming currents are used to make a change between the crystalline state and the amorphous state of the phase changeable material GST. A programming current, that is used to change the phase changeable material GST of a memory cell into the set state, is defined as a set current. A programming current, that is used to change the phase changeable material GST of a memory cell into the reset state, is defined as a reset current.

After the reset current is supplied to heat the phase changeable material GST for a given time at temperatures higher than a melting temperature, the phase changeable material GST cools rapidly and changes into the amorphous state. Also, if the set current is supplied to heat the phase changeable material GST for a given time at temperatures higher than a crystallization temperature and lower than the melting temperature, and then, the phase changeable material GST cools gradually and changes into the crystalline state. Meanwhile, because resistance values can be differentiated according to the crystalline volume or the amorphous volume of the phase changeable material GST, this can be used to construct a multi-level memory cell. In general, the reset current is higher than the set current and is flowed for a short time in comparison with the set current; and the set current is lower than the reset current and is flowed for a long time in comparison with the reset current. That is, the state of the phase changeable material GST is changed by a Joule heat of specific conditions generated by supply of the programming currents.

FIG. 1 is a diagram illustrating a structure of a phase-change memory cell.

As shown, a phase-change memory cell includes: a phase changeable element GST connected between a bit line BL and a first node NO; and a cell transistor MN1 connected between the first node NO and a ground voltage terminal VSS and controlled by a word line WL.

The above phase-change memory cell operates as follows.

First, an operation for programming data in the phase changeable element GST is as follows.

When the word line WL is activated to a high level to turn on the cell transistor MN1, a current path is formed between the ground voltage terminal VSS and the phase changeable element GST connected to the bit line BL. Thus, when a programming current corresponding to data is supplied to the phase changeable element GST through the bit line BL, the phase changeable element GST changes into a crystalline state or an amorphous state. In general, when programming data having a logic level of '1', a reset current is supplied to change the phase changeable element GST into a reset state; and when programming data having a logic level of '0', a set current is supplied to change the phase changeable element GST into a set state. The reset state, i.e., the amorphous state has a greater resistance value than the set state, i.e., the crystalline state.

Also, an operation for detecting data programmed in the phase changeable element GST is as follows.

When the word line WL is activated to a high level to turn on the cell transistor MN1, a current path is formed between the ground voltage terminal VSS and the phase changeable element GST connected to the bit line BL. Thus, when a given voltage or a given current is applied to the phase changeable element GST through the bit line BL, because the flowing current amount or the voltage drop level of the phase changeable element GST differs depending on the resistance value of the phase changeable element GST, this is used to determine data stored in the phase changeable element GST, that is, to determine the state of the phase changeable element GST.

FIG. 2 is a diagram illustrating another structure of a phase-change memory cell.

As shown, a phase-change memory cell includes: a cell diode D1 having a cathode connected to a word line WL and an anode connected to a first node NO; and a phase changeable element GST connected between a bit line BL and the first node NO.

The above phase-change memory cell operates as follows.

First, an operation for programming data in the phase changeable element GST is as follows.

When the word line WL is activated to a low level, i.e., a ground voltage level and a given voltage starts to be applied through the bit line BL, the cell diode D1 becomes a forward bias state. Therefore, the cell diode D1 is turned on when the voltage difference between the cathode and the anode of the cell diode D1 becomes greater than a threshold voltage. At this point, a current path is formed between the word line WL and the phase changeable element GST connected to the bit line BL. Thus, when a programming current corresponding to data is supplied to the phase changeable element GST through the bit line BL, the phase changeable element GST changes into a crystalline state or an amorphous state. In general, when programming data having a logic level of '1', a reset current is supplied to change the phase changeable element GST into a reset state; and when programming data having a logic level of '0', a set current is supplied to change the phase changeable element GST into a set state. The reset state, i.e., the amorphous state has a greater resistance value than the set state, i.e., the crystalline state.

Also, an operation for detecting data programmed in the phase changeable element GST is as follows.

When the word line WL is activated to a low level, i.e., a ground voltage level and a given voltage starts to be applied through the bit line BL, the cell diode D1 becomes a forward bias state. Therefore, the cell diode D1 is turned on when the voltage difference between the cathode and the anode of the cell diode D1 becomes greater than the threshold voltage. At this point, a current path is formed between the word line WL and the phase changeable element GST connected to the bit line BL. Thus, when a given voltage or a given current is applied to the phase changeable element GST through the bit line BL, because the flowing current amount or the voltage drop level of the phase changeable element GST differs depending on the resistance value of the phase changeable element GST, this is used to determine data stored in the phase changeable element GST, that is, to determine the state of the phase changeable element GST.

The structure of the phase-change memory cell of FIG. 2, which uses the cell diode D1 instead of the cell transistor, has good programming current supply characteristics because of the diode characteristics and is advantageous for high integration because of its small occupying area. Thus, a cell diode, rather than a cell transistor, is recently used to construct a phase-change memory cell.

Meanwhile, because a nonvolatile memory such as a phase-change memory requires more time for a program operation than for a read operation detecting data, it has a page buffer for compensating for such an operation time difference to perform a specific operation. In particular, a phase-change memory device can perform a buffer program operation that stores a plurality of input data in a page buffer and programs the data stored in the page buffer into a memory cell. The buffer program operation is performed according to a buffer program command sequence. For example, a buffer program command sequence, a word count value, a program address, and input data are sequentially applied to perform the buffer program operation. What is therefore required is a method for efficiently controlling the page buffer that performs the above operation.

SUMMARY OF THE INVENTION

Exemplary embodiments of the present invention are directed to provide a phase-change memory device that controls a page buffer by up-counting or down-counting a word count value of a command sequence.

In accordance with an aspect of the present invention, there is provided a phase-change memory device performing a buffer program operation, including a page buffer unit configured to store a plurality of input data corresponding to a word count value of a buffer program command sequence and selectively output the stored input data in response to a selection signal, and a page buffer control unit configured to generate the selection signal determined by counting a value representing the word count value.

In accordance with another aspect of the present invention, there is provided a phase-change memory device performing a buffer program operation, including a page buffer unit configured to store a plurality of input data corresponding to a word count value of a buffer program command sequence in response to an internal clock signal and selectively output the stored input data in response to a selection signal, and a page buffer control unit configured to generate the selection signal by up-counting or down-counting the word count value, and output the internal clock signal.

Some embodiments of the present invention employs a word count value of a command sequence to control an operation of outputting data stored in a page buffer during a buffer program operation that stores a plurality of input data in the page buffer and programs the data stored in the page buffer into a phase-change memory cell. That is, because a plurality of input data as many as the word count value are stored in the page buffer, an output operation of the page buffer is controlled using a counting signal that is generated by up-counting or down-counting the word count value.

BRIEF DESCRIPTION OF THE DRAWINGS

FIG. 8 is a diagram illustrating a buffer selection signal PB_CONTROL<0:7> and a buffer group selection signal PBG_EN<0:3> corresponding to an output signal CNT<0:4> of a counter.

FIG. 9 is a timing diagram illustrating a command sequence for a buffer program operation.

DESCRIPTION OF SPECIFIC EMBODIMENTS

In order to describe in detail such that those skilled in the art can easily implement the spirit and scope of the present invention, the embodiments of the present invention will be described with reference to the accompanying drawings.

In general, a logic signal of a circuit has a high level H or a low level L corresponding to a voltage level, which are also represented as '1' and '0', respectively. Also, if necessary, it is defined as having a high impedance (Hi-Z) state additionally. It should be noted that the terms PMOS (P-channel Metal Oxide Semiconductor) and NMOS (N-channel Metal Oxide Semiconductor) used herein denote the types of a MOSFET (Metal Oxide Semiconductor Field-Effect Transistor).

Figure 1:
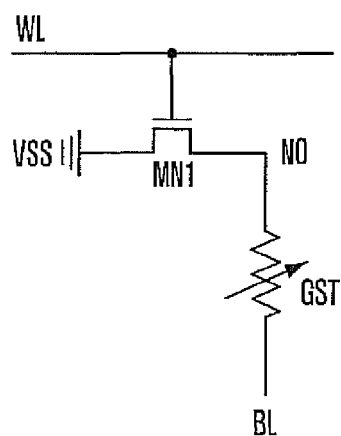
FIG. 1 is a diagram illustrating a structure of a phase-change memory cell.
Figure 2:
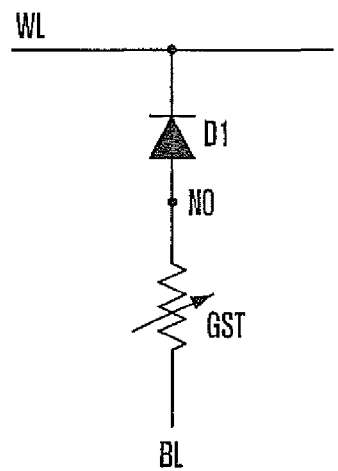
FIG. 2 is a diagram illustrating another structure of a phase-change memory cell.
Figure 3:
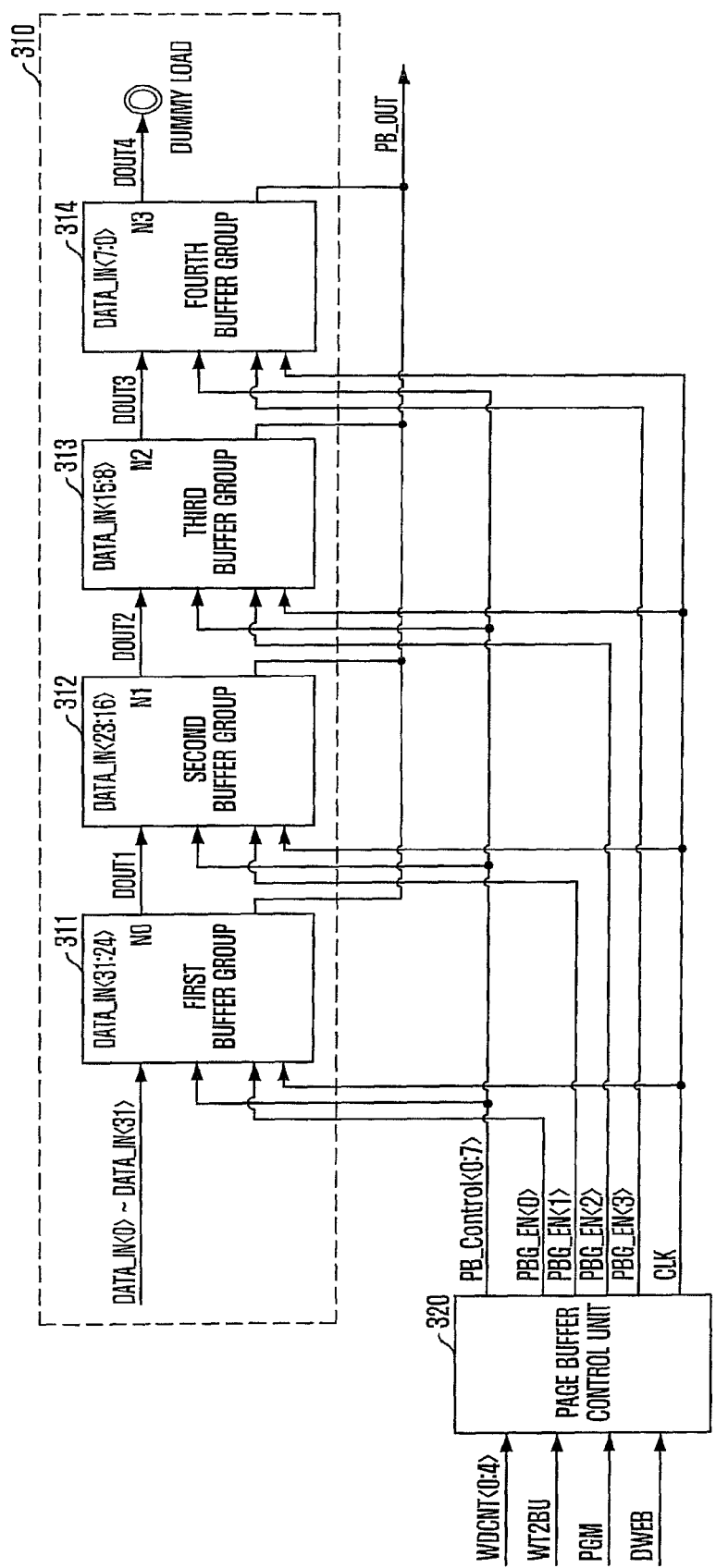
FIG. 3 is a diagram illustrating a structure of a phase-change memory device in accordance with an exemplary embodiment of the present invention.

FIG. 3 is a diagram illustrating a structure of a phase-change memory device in accordance with an exemplary embodiment of the present invention.

As shown, a phase-change memory device performing a buffer program operation in response to a buffer program command sequence includes a page buffer unit 310 and a page buffer control unit 320. The page buffer unit 310 stores a plurality of input data DATA_IN<0:31> as many as a word count value WD_CNT<0:4> of a command sequence in response to an internal clock signal CLK, and selectively outputs (PB_OUT) a plurality of stored input data DATA_IN<0:31> in response to selection signals PBG_EN<0:3> and PB_CONTROL<0:7>. The page buffer control unit 320 generates the selection signal PBG_EN<0:3> or PB_CONTROL<0:7> corresponding to a counting signal generated by up-counting or down-counting the word count value WD_CNT<0:4>, and outputs the internal clock signal CLK.

The detailed structure and main operation of the above phase-change memory device are as follows.

The page buffer unit 310 stores the plurality of input data DATA_IN<0:31>, which of number corresponds to the word count value WD_CNT<0:4> of the command sequence, in response to the internal clock signal CLK. The page buffer unit 310 selectively outputs (PB_OUT) the plurality of stored input data DATA_IN<0:31> in response to the selection signals PBG_EN<0:3> and PB_CONTROL<0:7>. Herein, the page buffer unit 310 includes a plurality of buffer groups 311 to 314, and each buffer group includes a given number of buffers. In an exemplary embodiment, the page buffer unit 310 includes four buffer groups 311 to 314, and each buffer group includes eight buffers, which stores a plurality of input data DATA_IN<0:31> applied through a data input/output pad DQ. Thus, a total of 64 input data is stored in the page buffer unit 310. Because a plurality of buffers are connected in series to each other, they store sequentially-applied input data DATA_IN<0:31> in a shift manner in response to the internal clock signal CLK. Also, the page buffer unit 310 outputs data (PB_OUT) stored in a corresponding buffer of a buffer group selected in response to a buffer group selection signal PBG_EN<0:3> and a buffer selection signal PB_CONTROL<0:7>. Herein, a data transmission node N3 of the fourth buffer group 314 is connected to a dummy load so that it has the same output resistance value as data transmission nodes N0, N1 and N2 of the first to third buffer groups 311 to 313.

Hereinafter, a detailed description will be given of the above-described buffer and buffer group.

Figure 4:
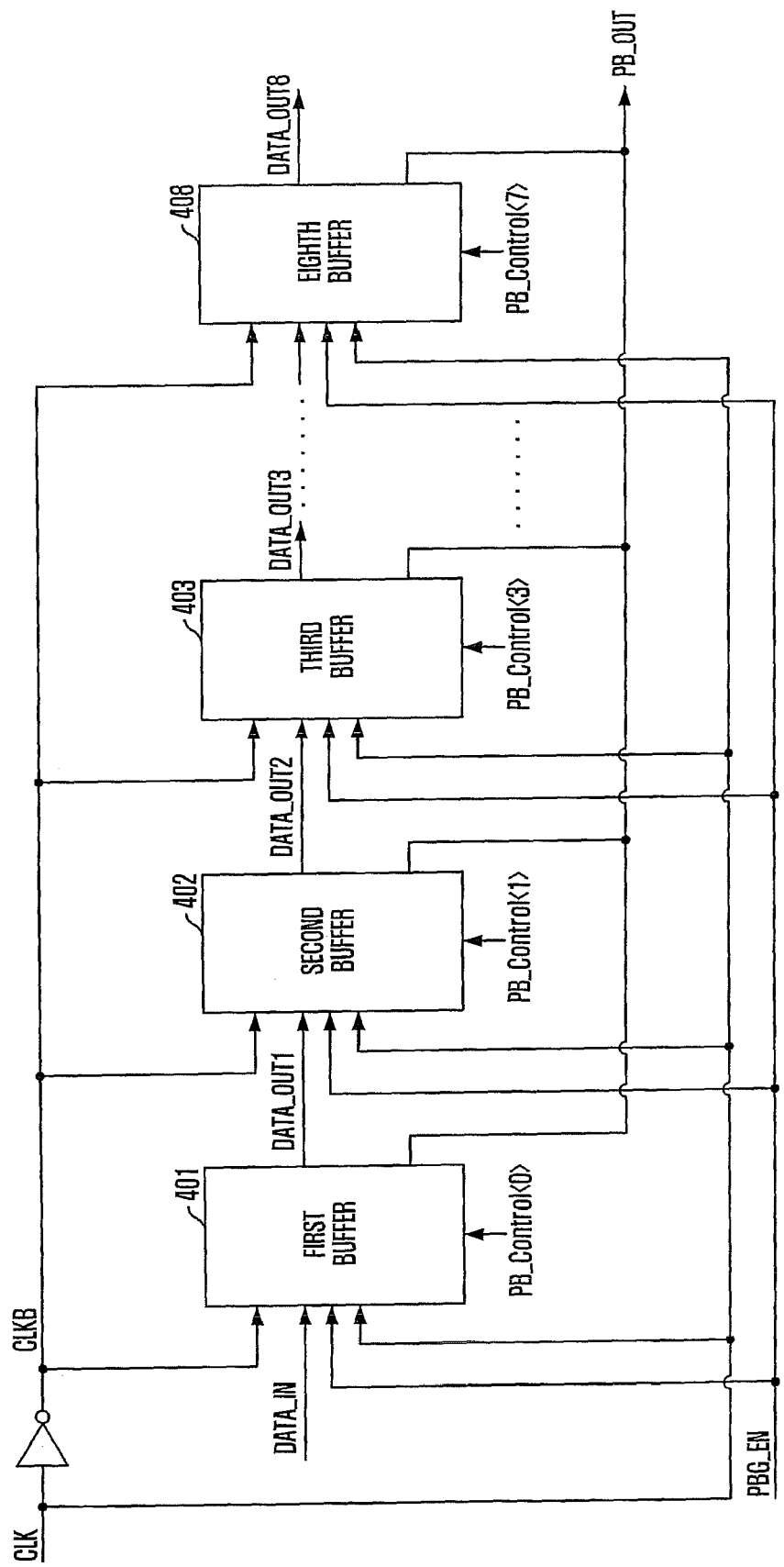
FIG. 4 is a diagram illustrating a structure of a buffer group of a page buffer unit of FIG. 3.

FIG. 4 is a diagram illustrating a structure of the buffer group of the page buffer unit of FIG. 3.

As shown, the buffer group includes eight buffers 401 to 408. Each buffer stores and transmits an applied input data DATA_IN or an output data DATA_OUT outputted from a connected buffer in response to the internal clock signal CLK. Also, when the buffer group selection signal PBG_EN is activated, data of the buffer selected by the buffer selection signal PB_CONTROL<0:7> are outputted (PB_OUT).

Figure 5:
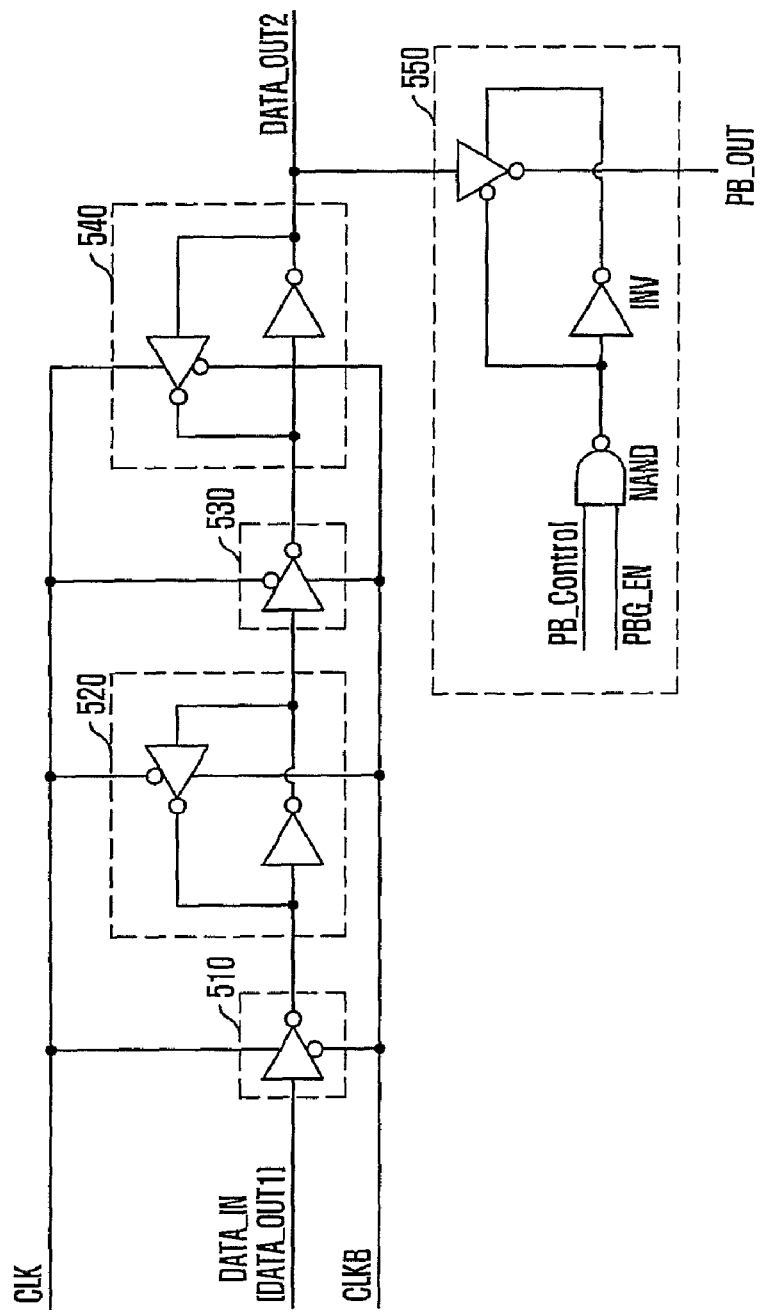
FIG. 5 is a circuit diagram of a buffer of FIG. 4 in accordance with an exemplary embodiment.

FIG. 5 is a circuit diagram of the buffer of FIG. 4 in accordance with an exemplary embodiment.

As shown, the buffer includes a first transmission unit 510, a first latch unit 520, a second transmission unit 530, a second latch unit 540, and a third transmission unit 550. The first transmission unit 510 transmits the applied input data DATA_IN (or the output data DATA_OUT1 outputted from a connected buffer) in response to a positive clock CLK of the internal clock signal. The first latch unit 520 stores a signal outputted from the first transmission unit 510 in response to a negative clock CLKB of the internal clock signal CLK. The second transmission unit 530 transmits data of the first latch unit 520 in response to a negative clock CLKB of the internal clock signal. The second latch unit 540 stores a signal outputted from the second transmission unit 530 in response to the positive clock CLK of the internal clock signal. The third transmission unit 550 outputs data of the second latch unit 540 in response to the buffer group selection signal PBG_EN and the buffer selection signal PB_CONTROL. Herein, the buffer latches the applied input data DATA_IN (or the output data DATA_OUT1 received from a connected buffer) according to control of the positive clock CLK and the negative clock CLKB of the internal clock signal. Also, the buffer outputs the latched data when the buffer group selection signal PBG_EN and the buffer selection signal PB_CONTROL are all activated to a high level. That is, data of the corresponding buffer are outputted (PB_OUT) when the buffer group selection signal PBG_EN of the buffer group assigned with the corresponding buffer and the buffer selection signal PB_CONTROL for selecting the corresponding buffer are all activated.

Hereinafter, a detailed description will be given of the page buffer control unit 320 of FIG. 3.

Figure 6:
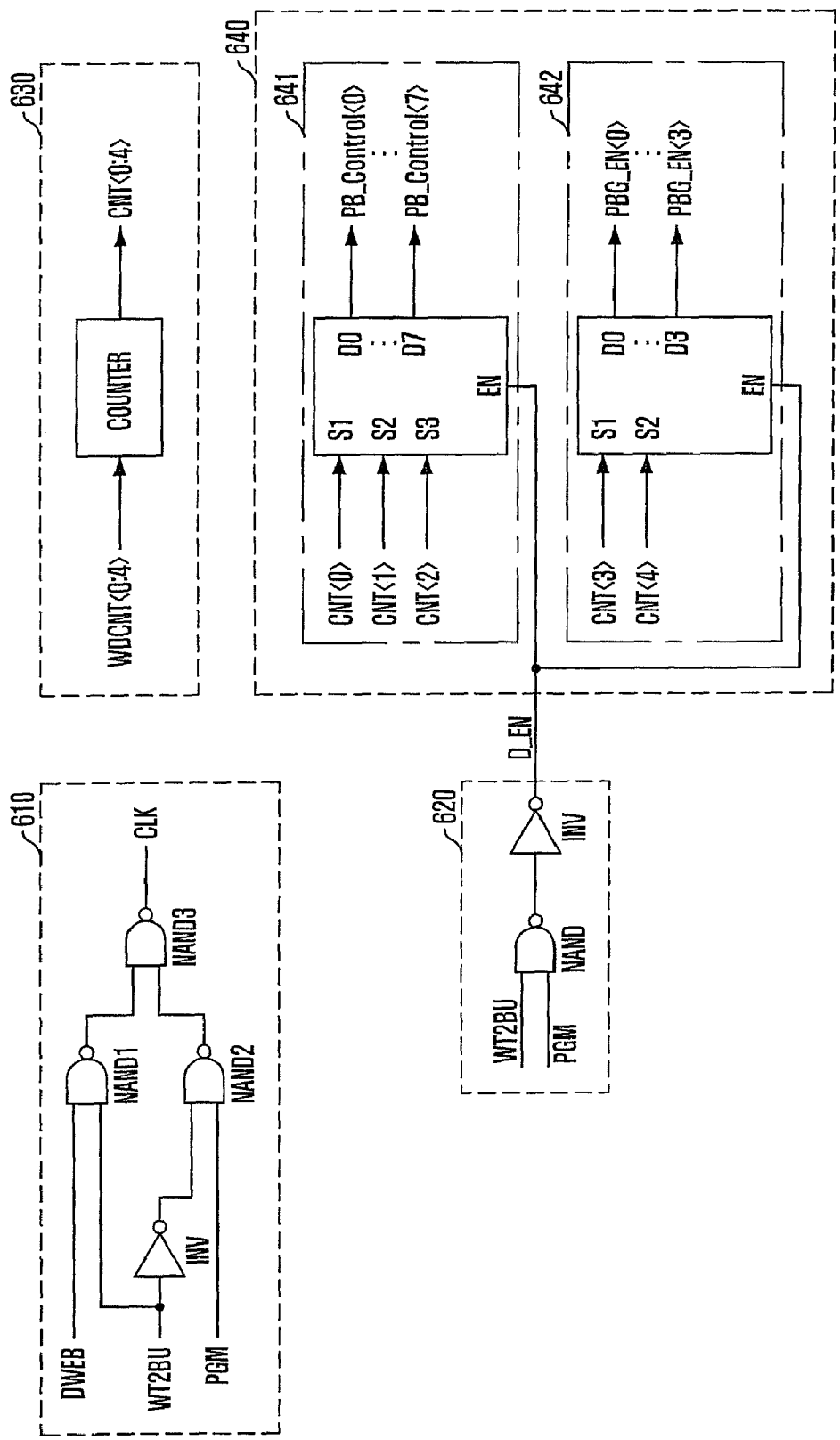
FIG. 6 is a diagram illustrating a structure of a page buffer control unit of FIG. 3.

FIG. 6 is a diagram illustrating a structure of the page buffer control unit 320 of FIG. 3.

As shown, the page buffer control unit 320 includes a clock signal generating unit 610, an enable signal generating unit 620, a counter 630, and a decoding unit 640. The clock signal generating unit 610 generates the internal clock signal CLK in response to a page buffer enable signal WT2BU, a write control signal DWEB, and a program mode signal PGM. The enable signal generating unit 620 generates a decoding enable signal D_EN in response to the page buffer enable signal WT2BU and the program mode signal PGM. The counter 630 up-counts or down-counts the word count value WD_CNT<0:4>. The decoding unit 640 outputs the buffer group selection signal PBG_EN<0:3> and the buffer selection signal PB_CONTROL<0:7> by decoding a signal CNT<0:4> outputted from the counter 630 in response to the decoding enable signal D_EN.

Herein, the clock signal generating unit 610 generates the internal clock signal CLK in response to the page buffer enable signal WT2BU, the write control signal DWEB, and the program mode signal PGM. The clock signal generating unit 610 includes NAND circuits NAND1 to NAND3, and an inverter INV1. The first NAND circuit NAND1 performs NAND-operation on the page buffer enable signal WT2BU and the write control signal DWEB. The inverter INV1 inverts the page buffer enable signal WT2BU. The second NAND circuit NAND2 performs NAND-operation on the program mode signal PGM and the output signal of the inverter INV1. The third NAND circuit NAND3 executes NAND-operation on the output signals of the first and second NAND circuits NAND1 and NAND2. A NAND gate is used as the NAND circuit. When the page buffer enable signal WT2BU is activated to a high level and the write control signal DWEB is toggled, the output signal of the clock signal generating unit 610, i.e., the internal clock signal CLK is toggled corresponding to the write control signal DWEB. When page buffer enable signal WT2BU is deactivated to a low level and the program mode signal PGM instructing a program operation is deactivated to a low level, the internal clock signal CLK is not toggled. For reference, a smaller number of logic gates may be used to reduce the circuit size of the clock signal generating unit 610.

Figure 7:
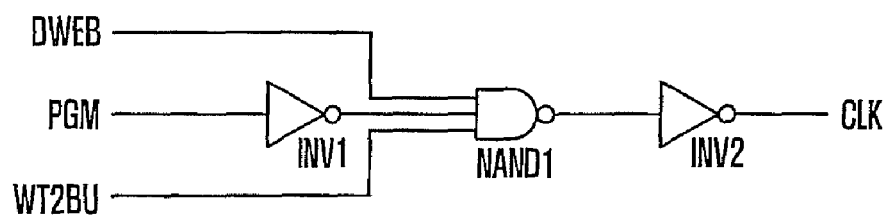
FIG. 7 is a diagram illustrating a clock signal generating unit of FIG. 6 in accordance with another embodiment of the present invention.

FIG. 7 is a diagram illustrating the clock signal generating unit of FIG. 6 in accordance with another embodiment of the present invention.

As shown, the clock signal generating unit includes a first inverter INV1, a NAND circuit NAND1, and a second inverter INV2. The first inverter INV1 inverts the program mode signal PGM. The NAND circuit NAND1 performs NAND-operation on the output signal of the first inverter INV1, the page buffer enable signal WT2BU, and the write control signal DWEB. The second inverter INV2 inverts the output signal of the NAND circuit NAND1. The clock signal generating unit of FIG. 7 is smaller than the clock signal generating unit 610 of FIG. 6 in terms of the number of logic gates but has the same function as the clock signal generating unit 610 of FIG. 6, and thus its detailed description will be omitted for conciseness.

Also, the enable signal generating unit 620 generates the decoding enable signal D_EN in response to the page buffer enable signal WT2BU and the program mode signal PGM. The enable signal generating unit 620 includes a NAND circuit NAND and an inverter INV. The NAND circuit NAND performs NAND-operation the page buffer enable signal WT2BU and the program mode signal PGM. The inverter INV inverts the output signal of the NAND circuit NAND. If the program mode signal PGM is activated to a high level when the page buffer enable signal WT2BU is activated to a high level, the decoding enable signal D_EN is activated to a high level to operate the decoding unit 610.

Also, the counter 630 up-counts or down-counts the applied word count value WD_CNT<0:4>. The word count value WD_CNT<0:4> of the command sequence represents the number of applied input data. Therefore, the word count value WD_CNT<0:4> is up-counted or down-counted to output data of the page buffer unit.

Also, the decoding unit 640 outputs the buffer group selection signal PBG_EN<0:3> and the buffer selection signal PB_CONTROL<0:7> by decoding the signal CNT<0:4> outputted from the counter 630 in response to the decoding enable signal D_EN. In an exemplary embodiment, the decoding unit 640 includes a first decoder 641 and a second decoder 642. The first decoder 641 is used to select the buffer, and the second decoder 642 is used to select the buffer group.

FIG. 8 is a diagram illustrating the buffer selection signal PB_CONTROL<0:7> and the buffer group selection signal PBG_EN<0:3> corresponding to the output signal CNT<0:4> of the counter. Herein, it is assumed that the counter performs a down-counting operation.

When the word count value of the command sequence is applied as '31', 32 input data DATA_IN<0:31> are stored in the page buffer unit. Also, the counter 630 down-counts the word count value '31' to output the signal CNT<0:4>, and the decoding unit 640 decodes the signal CNT<0:4> of the counter 630 to output the buffer group selection signal PBG_EN<0:3> and the buffer selection signal PB_CONTROL<0:7>. Referring to FIG. 8, it can be seen that each buffer group selection signal PBG_EN<i> and the corresponding buffer selection signal PB_CONTROL<K> are sequentially activated when the word count value is down-counted.

FIG. 9 is a timing diagram illustrating the command sequence for a buffer program operation.

Hereinafter, a buffer program operation of the phase-change memory device will be described with reference to the timing diagram of FIG. 9.

An internal operation according to the command sequence for the buffer program operation can be classified into the following four steps.

First, a buffer program command sequence is applied through an address channel A0:A24 and a data channel DQ0:DQ15. When '25h' of the buffer program command sequence is applied, the page buffer enable signal WT2BU is activated to a high level to generate the internal clock signal CLK corresponding to the write control signal DWEB.

Next, a word count value WC is applied through the data channel. The word count value represents the number of input data applied through the data channel.

Next, a pair of input data and a program address corresponding to the word count value is applied to the address channel and the data channel, and the applied input data are stored in the page buffer unit.

Lastly, when '29h' of the command sequence is applied through the data channel, the program mode signal PGM is activated to a high level so that the decoding unit outputs the buffer group selection signal PBG_EN<0:3> and the buffer selection signal PB_CONTROL<0:7>. Thus, data stored in the corresponding buffer of the page buffer unit selected by these two selection signals are programmed in the phase-change memory cell.

As described above, the present invention uses a word count value of a command sequence to control the page buffer in order to control the output of the page buffer, thus making it possible to greatly reduce the complexity and size of the control circuit.

While the present invention has been described with respect to the specific embodiments, it will be apparent to those skilled in the art that various changes and modifications may be made without departing from the spirit and scope of the invention as defined in the following claims.

For example, the configuration of active high or active low for representing the activation state of a signal and a circuit may vary depending on the embodiments. Also, according to circumstances, the structure of the transistor may vary to implement the same function. That is, the structures of the PMOS transistor and the NMOS transistor are interchangeable, which may be implemented using various transistors according to circumstances. Also, according to circumstances, the structure of the logic gate may vary to implement the same function. That is, a NAND circuit and a NOR circuit may be constructed through various combinations of a NAND gate, a NOR gate, and an inverter.

In particular, the embodiment exemplifies that the page buffer unit stores applied input data in response to the internal clock signal, but the input data may be stored according to control of other signals than the internal clock signal. Also, the command data and the input order of the command sequence applied through the data channel and the address channel may vary depending on embodiments. Also, the number of the buffer groups of the page buffer unit and the number of the buffers in each buffer group may vary depending on the embodiments. The number of modifications of such a circuit is numerous and such modifications can be easily made by those skilled in the art, a description of which will be omitted for simplicity.

What is claimed is:
1. A phase-change memory device performing a buffer program operation, comprising:
a page buffer unit configured to store a plurality of input data corresponding to a word count value of a buffer program command sequence and selectively output the stored input data in response to a selection signal; and a page buffer control unit configured to generate the selection signal determined by counting a value representing the word count value.

2. The phase-change memory device of claim 1, wherein the selection signal corresponds to a value subsequently counted from/to the word count value.

3. The phase-change memory device of claim 1, wherein the page buffer control unit includes:
 a counter configured to up-count or down-count the word count value; and
 a decoding unit configured to decode the output signal of the counter.

4. The phase-change memory device of claim 1, wherein the page buffer unit includes:
 a plurality of buffer groups; and
 a plurality of buffers assigned to the buffer group and connected in series to each other,
 wherein the page buffer unit outputs the input data stored in the corresponding buffer of the buffer group selected in response to a buffer group selection signal and a buffer selection signal of the selection signal.

5. The phase-change memory device of claim 1, wherein the buffer program command sequence is applied through an address channel and a data channel.

6. The phase-change memory device of claim 1, wherein the word count value is applied through a data channel.

7. A phase-change memory device performing a buffer program operation, comprising:
 a page buffer unit configured to store a plurality of input data corresponding to a word count value of a buffer program command sequence in response to an internal clock signal, and selectively output the stored input data in response to a selection signal; and
 a page buffer control unit configured to generate the selection signal by up-counting or down-counting the word count value, and output the internal clock signal.

8. The phase-change memory device of claim 7, wherein the page buffer control unit includes:
 a clock signal generating unit configured to generate the internal clock signal in response to a page buffer enable signal, a write control signal, and a program mode signal;
 an enable signal generating unit configured to generate a decoding enable signal in response to the page buffer enable signal and the program mode signal;
 a counter configured to up-count or down-count the word count value; and
 a decoding unit configured to output a buffer group selection signal and a buffer selection signal as the selection signal by decoding the output signal of the counter in response to the decoding enable signal.

9. The phase-change memory device of claim 8, wherein the clock signal generating unit includes:

a first NAND gate configured to perform NAND-operation on the page buffer enable signal and the write control signal;
an inverter configured to invert the page buffer enable signal;
a second NAND gate configured to performs NAND-operation on the program mode signal and an output signal of the inverter; and
a third NAND gate configured to performs NAND-operation on output signals of the first and second NAND gates.

10. The phase-change memory device of claim 8, wherein the clock signal generating unit includes:
 a first inverter configured to invert the program mode signal;
 a NAND gate configured to performs NAND-operation on an output signal of the first inverter, the page buffer enable signal, and the write control signal; and
 a second inverter configured to invert an output signal of the NAND unit.

11. The phase-change memory device of claim 8, wherein the enable signal generating unit includes:
 a NAND gate configured to perform NAND-operation on the page buffer enable signal and the program mode signal; and
 an inverter configured to invert an output signal of the NAND gate.

12. The phase-change memory device of claim 8, wherein the page buffer unit includes:
 a plurality of buffer groups; and
 a plurality of buffers assigned to the buffer group and connected in series to each other,
 wherein the page buffer unit outputs the input data stored in the corresponding buffer of the buffer group selected in response to the buffer group selection signal and the buffer selection signal.

13. The phase-change memory device of claim 12, wherein each of the buffers includes:
 a first transmission unit configured to transmit applied input data in response to a positive clock of the internal clock signal;
 a first latch unit configured to store transmitted data outputted from the first transmission unit in response to a negative clock of the internal clock signal;
 a second transmission unit configured to transmit stored data of the first latch unit in response to a negative clock of the internal clock signal;
 a second latch unit configured to store transmitted data outputted from the second transmission unit in response to a positive clock of the internal clock signal; and
 a third transmission unit configured to output stored data of the second latch unit in response to the buffer group selection signal and the buffer selection signal.

14. The phase change memory device of claim 7, wherein the buffer program command sequence is applied through an address channel and a data channel.

15. The phase change memory device of claim 7, wherein the word count value is applied through a data channel.

* * * * *

UNITED STATES PATENT AND TRADEMARK OFFICE
CERTIFICATE OF CORRECTION

PATENT NO.         : 8,045,368 B2                                    Page 1 of 1
APPLICATION NO.    : 12/345949
DATED              : October 25, 2011
INVENTOR(S)        : Ho-Seok Em It is certified that error appears in the above-identified patent and that said Letters Patent is hereby corrected as shown below:

Title Page Item 56
Insert non patent literature document in OTHER PUBLICATIONS in References Cited as follows:

--OTHER PUBLICATIONS
Notice of Preliminary Rejection issued from Korean Intellectual Property Office on May 31, 2010.

"NOR FLASH MEMORY", Revision 1.2, September, 2006, pp. 10 & 35, – SAMSUNG ELECTRONICS, Republic of Korea--

Signed and Sealed this
Twentieth Day of December, 2011

David J. Kappos
*Director of the United States Patent and Trademark Office*